United States Patent [19]

Yoshida et al.

[11] 4,021,748
[45] May 3, 1977

[54] AMPLIFIER WITH FIELD EFFECT TRANSISTORS HAVING TRIODE-TYPE DYNAMIC CHARACTERISTICS

[75] Inventors: Tadao Yoshida; Tadao Suzuki, both of Tokyo, Japan

[73] Assignee: Sony Corporation, Tokyo, Japan

[22] Filed: Dec. 18, 1975

[21] Appl. No.: 641,981

[30] Foreign Application Priority Data

Dec. 23, 1974  Japan .................... 49-147885

[52] U.S. Cl. .................... 330/15; 330/24; 330/35; 330/207 A
[51] Int. Cl.² .................... H03F 3/26
[58] Field of Search .......... 330/10, 15, 17, 13, 330/24, 35, 207 A; 329/106; 307/251

[56] References Cited

UNITED STATES PATENTS

| 3,336,538 | 8/1967 | Crowhurst | 330/207 A |
| 3,636,372 | 1/1972 | Hujita et al. | 307/251 |
| 3,921,089 | 11/1975 | Tsurushima | 330/22 X |

*Primary Examiner*—James B. Mullins
*Attorney, Agent, or Firm*—Lewis H. Eslinger; Alvin Sinderbrand

[57] ABSTRACT

An amplifier having ready application as an amplifier for pulse width modulated signals, is comprised of first and second field effect transistor devices which exhibit triode-type dynamic characteristics. These field effect transistor devices are connected in push-pull amplifying relation for receiving a signal to be amplified and for supplying an amplified signal to a load. A low-pass filter device connects the load to the push-pull field effect transistor devices. The output terminals of the field effect transistor devices are connected in series across a voltage supply which is used to supply the energizing voltages to the transistor devices.

13 Claims, 20 Drawing Figures

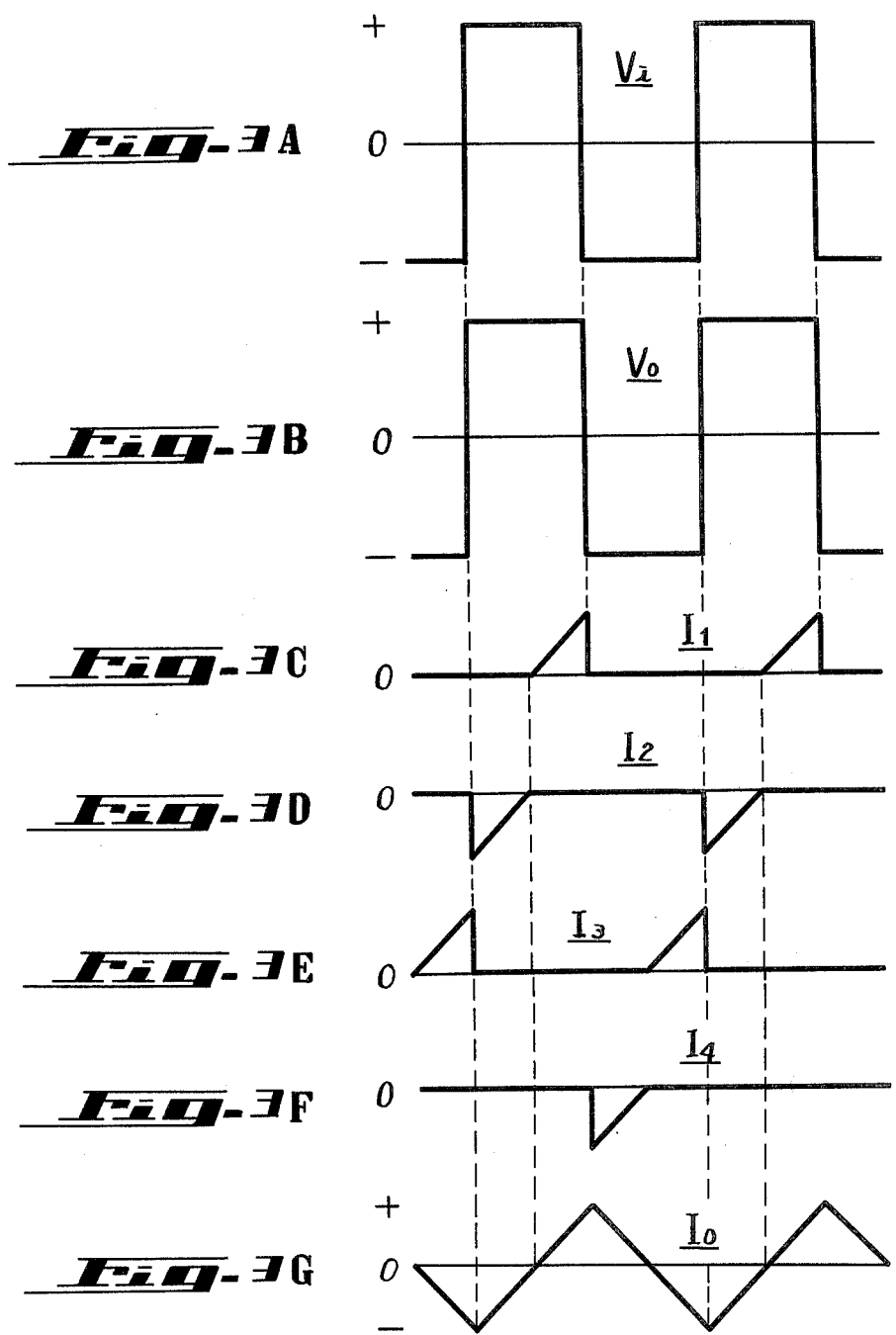

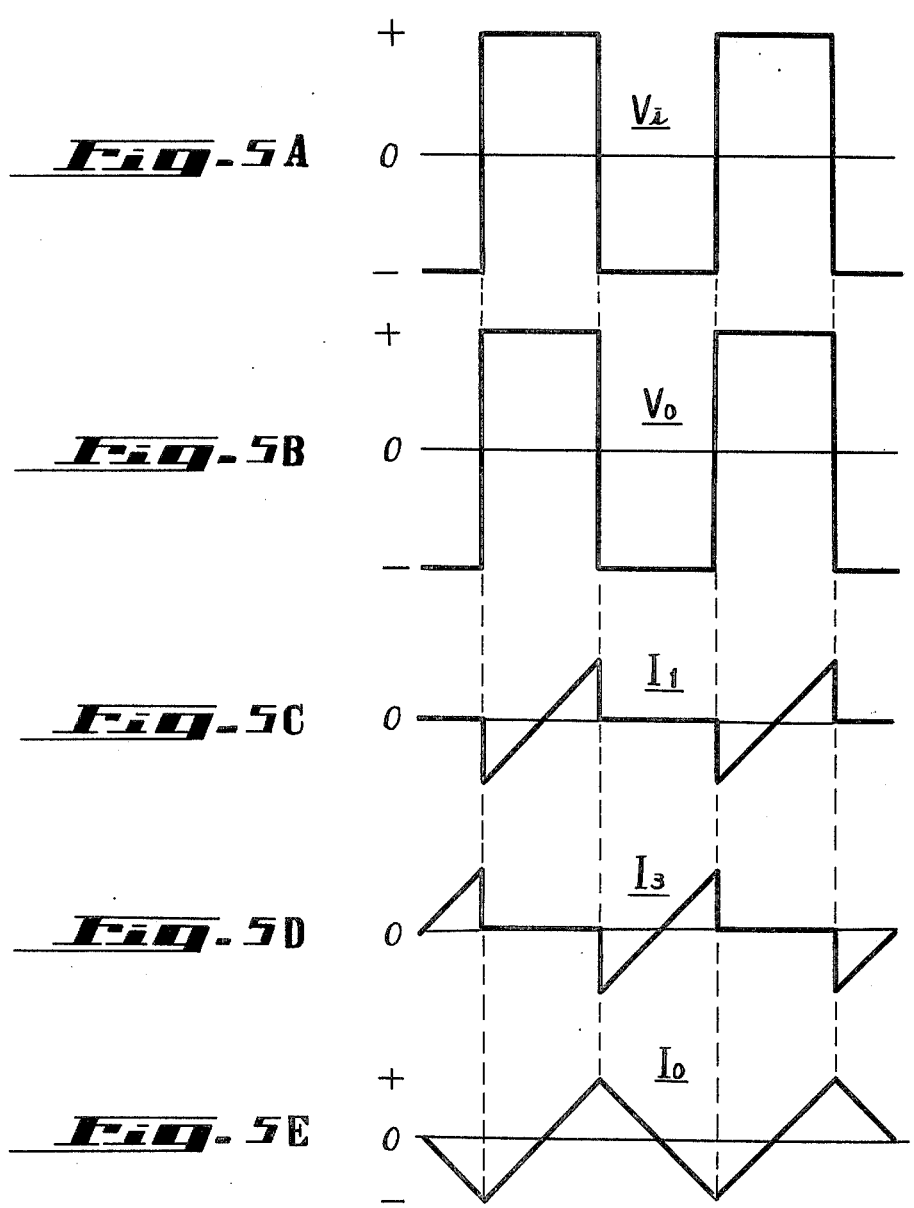

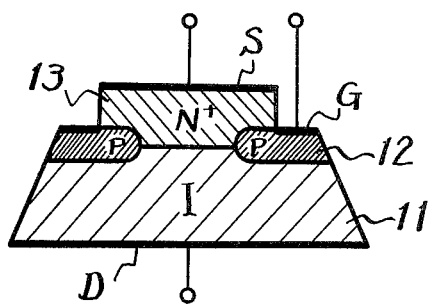
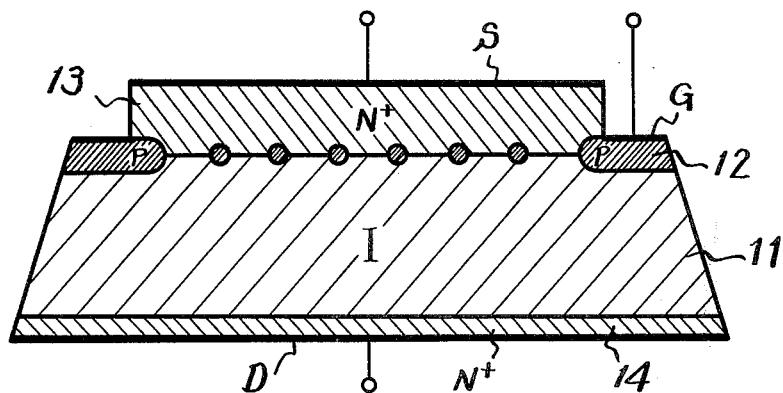
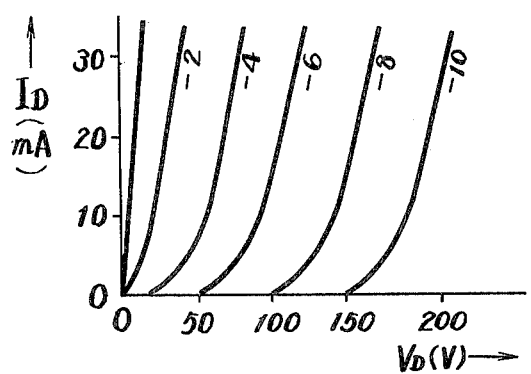

AMPLIFIER WITH FIELD EFFECT TRANSISTORS HAVING TRIODE-TYPE DYNAMIC CHARACTERISTICS

BACKGROUND OF THE INVENTION

This invention relates to an amplifier which is particularly useful for amplifying pulse width modulated signals and, in particular, to such an amplifier having field effect transistors which exhibit triode-type dynamic characteristics and which is of relatively simple and inexpensive construction.

In amplifiers which are to be used with pulse width modulated signals, it is desirable to minimize the switching distortion attending the switching of the amplifying elements due to the pulse signals. A preferred amplifier configuration is a push-pull amplifier. In a simple embodiment thereof, such a push-pull amplifier is provided with a pair of bi-polar transistors connected in the recognized push-pull relation. When used with a pulse signal, such as a pulse width modulated (PWM) signal, the bi-polar transistors not only must amplify the signal but also must be switched on and off in response to the PWM signal. Unfortunately, such switching of a typical bi-polar transistor is accompanied by deleterious switching distortion which is attributed to the storage carriers which are included in the bi-polar transistor.

Since the field effect transistor (FET) does not rely on such storage carriers for its operation, the FET is known to exhibit desirable switching characteristics. Hence, it may be thought that the use of an FET in, for example, a push-pull amplifier for PWM signals might be an advantageous circuit configuration. Unfortunately, most FET's which have been known heretofore exhibit a relatively small drain current capacity. This limits the amount of amplification which can be obtained therefrom and thus constrains the use of such an FET in an amplifying device.

Recently, an FET of the type having triode-type dynamic characteristics has been developed. This type of FET offers many advantageous features, such as a very small output resistance, the avoidance of drain current saturation with an increase in drain voltage and superior voltage-current characteristics linearity. Moreover, this type of FET has a larger drain current capacity than that of the prior art FET. Because of these characteristics, as well as excellent switching characteristics, this recently developed FET finds ready application in Class-B push-pull amplifiers for audio signals.

The present invention proceeds upon the use of such an FET having triode-type dynamic characteristics in an amplifier circuit for use with PWM signals. It is believed that improved results can be attained over prior art amplifiers when constructed of such FET devices. For example, in the prior art amplifier, bi-polar transistors are connected in push-pull relation to supply the amplified PWM signal to a load through a low-pass filter, such as a choke coil. At a pulse transition, when the amplified PWM signal changes its amplitude (or polarity), a reverse current is produced by the choke coil, which is a discharge current therefor. However, because the bi-polar transistors generally are not capable of providing a path for this reverse current, it is necessary to use discharge diodes which are connected across the collector-emitter circuit of each transistor. While these diodes thus serve to discharge the choke coil, they must be capable of accommodating current switching frequencies of a relatively high frequency range. As is known, such high frequency diodes are costly.

OBJECTS OF THE INVENTION

Therefore, it is an object of the present invention to provide an improved amplifier which is readily adapted to amplify PWM signals and which does not suffer from the drawbacks found in prior art amplifier circuits.

Another object of this invention is to provide an improved amplifier of relatively simple construction and low cost which is capable of accommodating high switching frequencies for use as a PWM signal amplifier.

A further object of this invention is to provide an improved amplifier for use with PWM signals which includes FET's having triode-type dynamic characteristics as the switching elements therein.

An additional object of this invention is to provide an amplifier formed of FET's having triode-type dynamic characteristics connected in complementary push-pull drain-follower configuration, each FET being operable to conduct in the forward and reverse direction, respectively.

Yet another object of this invention is to provide an improved amplifier for use with PWM signals, including FET's having triode-type dynamic characteristics, and further including circuit elements which prevent the FET from being over-biased in the forward direction, thereby improving the switching speed thereof.

A still further object of the present invention is to provide an improved amplifier for use with PWM signals, including FET's having triode-type dynamic characteristics connected in Class-D configuration.

Various other objects and advantages of the present invention will become apparent from the ensuing detailed description, and the novel features will be particularly pointed out in the appended claims.

SUMMARY OF THE INVENTION

In accordance with this invention, an amplifier is comprised of first and second field effect transistor devices connected in push-pull drain-follower amplifying relation, each of the field effect transistor devices exhibiting triode-type dynamic characteristics and adapted to supply an amplified signal to a load connected thereto by a low-pass filter device; the drain and source electrodes of the field effect transistor devices being connected in series across a voltage supply for receiving respective energizing voltages. In one embodiment, the field effect transistor devices operate as a Class-D amplifier and are provided with circuit elements to prevent them from being heavily forward biased.

BRIEF DESCRIPTION OF THE DRAWINGS

The following detailed description, given by way of example, will best be understood in conjunction with the accompanying drawings in which:

FIGS. 3A–3G are waveform diagrams which represent the operation of various circuit components shown in the FIG. 2 embodiment;

FIGS. 5A–5E are waveform diagrams which represent the operation of various components in the circuit shown in FIG. 4;

FIG. 8 is a cross-sectional view of an FET with triode-type dynamic characteristics which can be used with the amplifier of this invention;

FIG. 9 is a cross-sectional view of another example of an FET with triode-type dynamic characteristics which also can be used in the amplifier of this invention; and FIG. 10 is a graph showing the current-voltage characteristics at the drain electrode of the FET's shown in FIGS. 8 and 9.

DETAILED DESCRIPTION OF CERTAIN PREFERRED EMBODIMENTS

Figure 1:
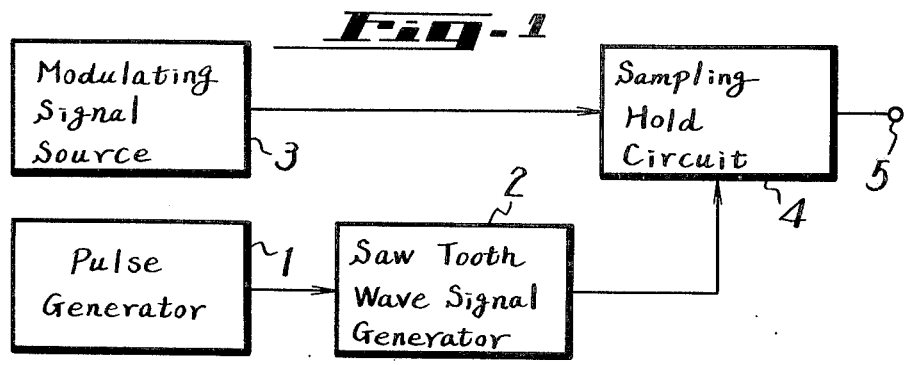
FIG. 1 is a block diagram showing one example of a PWM circuit which can be used to supply PWM signals to the amplifier of the present invention.

Before describing the amplifier which can be used with PWM signals, reference is made to FIG. 1 which shows one example of a circuit which can be used as a source of such PWM signals. A pulse generator 1 adapted to produce periodic pulse signals of rectangular waveform is connected to a sawtooth wave generator 2, this sawtooth wave generator being connected, in turn, to a sample and hold circuit 4. The frequency of the sawtooth waveform produced by the sawtooth wave generator 2 will be proportional to the frequency of the pulse signals produced by the pulse generator 1. A source of information signal 3, such as an audio signal source, also is connected to the sample and hold circuit 4. The output of the sample and hold circuit is connected to an output terminal 5 from which the PWM signal is obtained. The frequency of this PWM signal is determined by the pulse generator 1, and the pulse width of each output pulse is representative of the information contained in the information signal supplied from the source 3.

Figure 2:
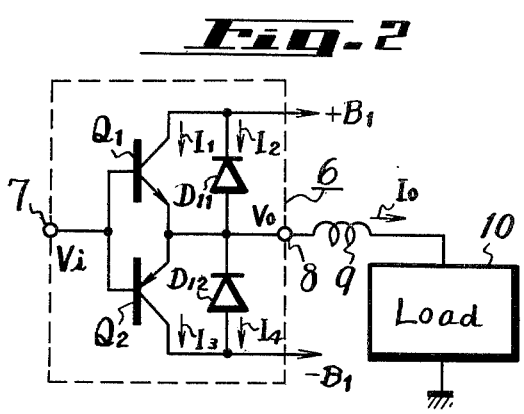
FIG. 2 is a schematic diagram showing one example of an amplifier which can be used with PWM signals and which is formed of bi-polar transistors.

Referring now to FIG. 2, one embodiment of an amplifier which is capable of amplifying the PWM signal which may be produced by the circuit shown in FIG. 1 is illustrated, and is seen to be comprised of bi-polar transistors $Q_1$ and $Q_2$. The transitors $Q_1$ and $Q_2$ are complementary and are arranged as a Class-D push-pull amplifier 6 connected to an output terminal 8 from which the amplified PWM signal is supplied to a load 10 which is connected to the output terminal by a low-pass filter. The illustrated circuit serves to amplify the PWM signal and to recover the original modulating signal, such as the original audio signal, which then is supplied to the load 10. In one application thereof, the load 10 may comprise loudspeaker systems.

The Class-D amplifier exhibits high efficiency and the transistors operate with substantially no non-linearity. Consequently, the transistors $Q_1$ and $Q_2$ need not be closely matched. As shown, the base electrodes of the complementary transitors $Q_1$ and $Q_2$ are connected in common to an input terminal 7 and are adapted to receive an input signal, such as a PWM signal, $V_i$ which is supplied to drive the transistors in push-pull relation. The common-connected emitter electrodes of these transistors are connected to the output terminal 8 whereat the output signal $V_o$ is derived. A suitable voltage supply is connected across the collector electrodes of the respective transistors and is adapted to supply respective energizing voltages $+B_1$ and $-B_1$ to these transistors, as shown. In addition, discharge diodes $D_{11}$ and $D_{12}$ are connected across the collector-emitter circuits of the transistors $Q_1$ and $Q_2$, respectively, in order to provide a discharge path for the reverse current which is generated by the low-pass filter, which may be a choke coil, as will be described.

The operation of the amplifier 6 shown in FIG. 2 can best be understood by referring to the waveform diagram shown in FIG. 3. For the purpose of this description, it will be assumed that the input signal supplied to terminal 7 to be amplified is a PWM signal $V_i$. The operation of the circuit will be described for the case wherein the pulse carrier is not modulated with information, and the non-modulated carrier has a duty factor of 50%, as shown in FIG. 3A. The amplified pulse output voltage $V_o$ supplied to the output terminal 8 by the complementary push-pull bi-polar transistor amplifier 6 is seen from FIG. 3B to have the same waveform as the input voltage $V_i$. The forward current $I_o$ which is supplied to the load 10 by the choke coil 9 is assumed to flow in the direction indicated in FIG. 2. It is appreciated that the choke coil, or other low pass filter device, serves to remove the carrier from the output voltage $V_o$ supplied to the output terminal 8.

Let it be assumed that the input voltage $V_i$ (and thus the output voltage $V_o$) undergoes a negative transition, as illustrated. Immediately prior to this transition, the current $I_o$ flows in the indicated direction through the choke coil to the load. Since the current through an inductance cannot change instantaneously, it is appreciated that, at the voltage transition, a discharge path must be provided in order to discharge the energy stored in the choke coil. Immediately following this voltage transition, the transistor $Q_2$ is turned on, but is not capable of conducting the necessary reverse current therethrough which is produced as a discharge current by the choke coil. However, at this time, the diode $D_{12}$ is suitably biased so that a discharge current $I_4$ can flow therethrough. As seen from FIG. 3F, this current $I_4$ is indicated to be of negative polarity and, hence, flows in a direction opposite to the arrow indicated in FIG. 2.

Once the choke coil 9 has been sufficiently discharged, the current $I_o$ flows therethrough in a negative direction and thence as the current $I_3$ through the conducting transistor $Q_2$. This current is shown in FIG. 3E and is of positive polarity. Hence, the current $I_3$ flows through the transistor $Q_2$ in the direction indicated by the arrow of FIG. 2.

Let it now be assumed that, while the transistor $Q_2$ is conducting, a positive transition appears in the input voltage $V_i$ applied to the input terminal 7 (and thus in the output voltage $V_o$). This abrupt change in the voltage causes the current $I_o$, which had been negative, to change. Since this current through the inductance cannot change instantaneously, a discharge path must be provided therefor. Although the transistor $Q_1$ now is conductive, the reverse current produced by the choke coil, which is of negative polarity, cannot flow through this transistor. However, the diode $D_{11}$ provides a suitable discharge path for this reverse current and a choke coil discharge current $I_2$ flows through the diode. As indicated in FIG. 3D, this discharge current $I_2$ is negative, and thus flows in a direction opposite to the arrow indicated in FIG. 2. Now, once the choke coil 9 is discharged sufficiently, the current $I_o$ can flow in the positive direction, indicated by the arrow in FIG. 2, and is supplied through the conducting transistor $Q_1$ by the current $I_1$. As shown in FIG. 3C, the current $I_1$ is of positive polarity, and thus flows through the conducting transistor $Q_1$ in the direction indicated by the arrow in FIG. 2.

The resultant current $I_0$ which flows through the choke coil 9 to the load 10 in response to the non-modulated input signal is shown as the triangular waveform in FIG. 3G.

It is appreciated that, since the bi-polar transistors $Q_1$ and $Q_2$ are not capable of conducting reverse currents produced by the choke coil 9, the discharge diodes $D_{11}$ and $D_{12}$ must be provided. However, these diodes must be capable of accommodating the relatively high frequency switching pulses represented by the voltage waveforms shown in FIGS. 3A and 3B. However, as is known to those of ordinary skill in the art, such diodes are relatively expensive.

Figure 4:
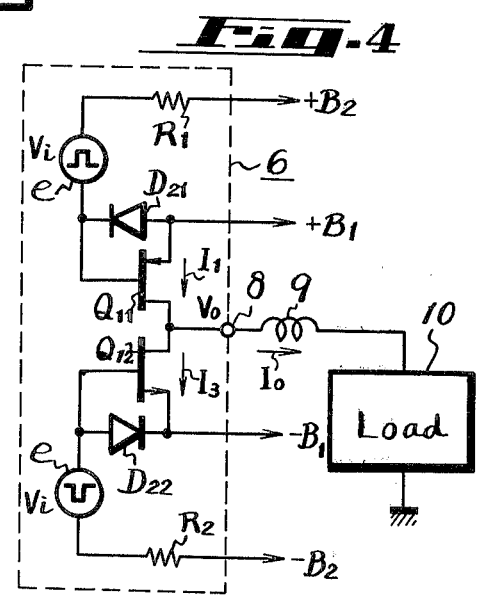
FIG. 4 is a schematic diagram of one embodiment of an amplifier in accordance with the present invention.

One embodiment of an improved amplifier in accordance with the teachings of the present invention is shown in FIG. 4, whereby the expensive, higher frequency discharge diodes which were necessary for the FIG. 2 embodiment are obviated. The amplifier 6 of FIG. 4 is well-suited to amplify PWM signals and to supply the amlified signals to the load 10 through a low-pass filter, such as the choke coil 9. This circuit is comprised of complementary FET's $Q_{11}$ and $Q_{12}$ which are connected in push-pull drain-follower relation, as shown. Each of these FET's has triode-type dynamic characteristics which will be described hereinbelow. The source-drain circuits of these FET's are connected in series across a voltage supply which is capable of supplying the energizing voltages $+B_1$ and $-B_1$ to the respective source electrodes, as shown. The input signal $V_i$ is supplied to the FET's so as to drive them in the push-pull mode. In order to simplify the explanation of the illustrated embodiment, the signal supply is depicted as the signal sources $e$ which are capable of supplying the positive portion of the signal to the FET $Q_{11}$ and the negative portion of the signal to the FET $Q_{12}$. Of course, it should be appreciated that conventional signal supply elements, such as an input transformer, a phase splitter, or the like, are used to supply these FET's. A second voltage supply is connected across the input signal sources so as to supply an energizing voltage $+B_2$ through a resistor $R_1$ to the source $e$, which is shown to be connected to the FET $Q_{11}$, and to supply the energizing voltage $-B_2$ through a resistor $R_2$ to the source $e$, which is shown to be connected to the FET $Q_{12}$.

In the illustrated embodiment, the FET $Q_{11}$ is assumed to be a P-channel FET and the FET $Q_{12}$ is assumed to be an N-channel FET. As is known, a relatively negative gate-source voltage applied to a P-channel FET is a forward bias voltage which is effective to drive that FET further into its forward biased region. Conversely, a relatively positive gate-source voltage applied to an N-channel FET is a forward bias voltage which is effective to drive that FET further into its forward biased region. In order to improve the switching time of the FET, it is preferred to limit the degree to which it is driven into its forward biased region. This is achieved by limiting the forward bias gate-source voltage which can be applied thereto. This forward bias voltage limitation is attained by the limiting diodes $D_{21}$ and $D_{22}$ which are connected across the gate-source circuits of the respective FET's $Q_{11}$ and $Q_{12}$. Each limiting diode is poled in the same direction as its associated gate-source junction. Thus, it is appreciated that the forward bias voltage which can be applied to each FET is limited to the intrinsic diode voltage drop.

The operation of the amplifier circuit shown in FIG. 4 can best be appreciated by referring to the waveform diagrams of FIGS. 5A–5E. It will be assumed that the input voltage $V_i$ is a PWM signal and, as shown in FIG. 5A, a non-modulated carrier is applied. It will be further assumed that the amplified output voltage $V_o$ which is applied to the output terminal 8 of the amplifier 6 has the same waveform as the input voltage, as shown in FIG. 5B. Let it be assumed that the input voltage $V_i$ (and thus the amplified voltage $V_o$) exhibits a negative-going transition. Immediately prior to this transition, current $I_o$ flows through the choke coil 9 in the positive direction, as indicated by the arrow in FIG. 4. This current had been derived from the current flowing through the then conducting FET $Q_{11}$. At the negative transition, the FET $Q_{11}$ is turned off and the FET $Q_{12}$ is turned on. It is recalled that the current through the choke coil 9 cannot change instantaneously. An energy discharge path must be provided for the reverse current which is produced by the choke coil. Since the FET's have triode-type dynamic characteristics, they are capable of conducting current in the forward current mode or in the reverse current mode. That is, the drain-source current can be either positive or negative when the FET is rendered conductive. Thus, when the FET $Q_{12}$ is turned on immediately following the negative transition in the input voltage, the reverse current produced by the choke coil 9 flows through this conducting FET. While the choke coil discharges, it is appreciated that the current $I_3$ through the FET $Q_{12}$ is negative. This is indicated in FIG. 5D, and the current $I_3$ flows in a direction opposite to the arrow indicated in FIG. 4. Once the choke coil 9 has sufficiently discharged, the current $I_o$ therethrough flows in the negative direction. Consequently, the current $I_3$ through the conducting FET $Q_{12}$ flows in the positive direction, as indicated by the arrow in FIG. 4, from the drain to the source electrode. The waveform for the current $I_3$ is shown in FIG. 5D.

Now, when the input voltage $V_i$ (and thus the amplified voltage $V_o$) undergoes a positive-going transition, the choke coil 9 again must discharge. At this time, the FET $Q_{12}$ is rendered non-conductive and the FET $Q_{11}$ is turned on. Consequently, a reverse discharge path is provided for the reverse current produced by the choke coil 9 through the conducting FET $Q_{11}$. This is represented in FIG. 5C by the current $I_1$ which is seen to be negative. That is, the current $I_1$ flows through the drain-source circuit of the FET $Q_{11}$ in a direction opposite to the arrow which is indicated in FIG. 4. Once the choke coil 9 has sufficiently discharged, a positive current $I_o$ flows therethrough. This positive current is supplied by the current $I_1$ which now flows in the direction indicated by the arrow in FIG. 4, and is graphically depicted in FIG. 5C.

Since the FET currents $I_1$ and $I_3$ can flow therethrough in the forward and reverse modes, the current $I_o$ through the choke coil 9 to the load 19 is seen to be a composite current formed of the FET currents. This is shown in FIG. 5E.

Figure 6:
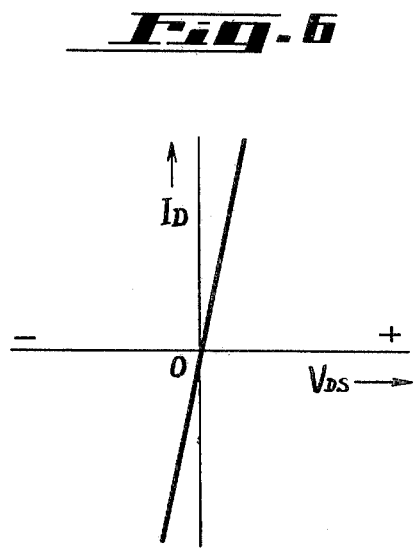
FIG. 6 is a graphical representation of the current-voltage characteristics of the FET's used in the circuit of FIG. 4.

A composite current-voltage characteristic for the push-pull drain-follower configuration of the FET's $Q_{11}$ and $Q_{12}$ is graphically depicted in FIG. 6. The abscissa $V_{TS}$ represents the drain-source voltage of these FET3 s and the ordinate $I_D$ represents the drain current. It may be observed that the slope of the positive current-voltage characteristic differs from the slope of the negative current-voltage characteristic. This indicates that the forward conductance and forward breakdown voltage differ, respectively, from the reverse conductance and reverse breakdown voltage. When current is supplied positively to the choke coil 9 and thence to the load 10, it is preferred to operate the FET's in the common source, or drain-follower, mode. This provides a voltage gain generally greater than unity and the circuit output impedance typically is equal to the resistance of the load connected to the drain electrode. Now, when a reverse current flows through the choke coil 9 to discharge the coil, the conducting FET is operated, effectively, as a source-follower. In this mode, the load presented to the reverse current is substantially the same as the load which is presented to the positive current. However, even assuming that the forward breakdown voltage of each FET is greater than its reverse breakdown voltage, the FET will not be damaged when operated in its reverse conducting mode (i.e., as a source-follower). This is because the reverse voltage which is applied to the drain by the reverse current caused by the discharge of the choke coil generally is smaller than the energizing voltage $+B_1$ or $-B_1$ which is applied to the respective source electrodes.

It is appreciated that, by limiting the forward bias voltage which can be applied to each FET by the clamping diodes $D_{21}$ and $D_{22}$, the switching characteristics of the FET's are improved. That is, it is not necessary to drive the FET out of a deeply forward-biased condition.

Figure 7:
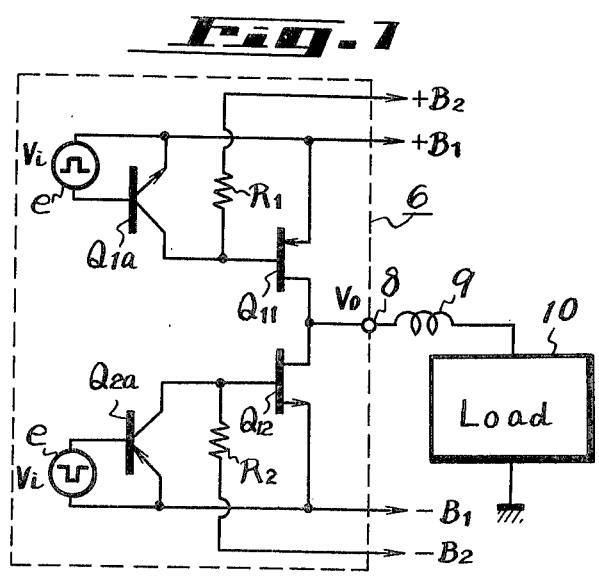
FIG. 7 is a schematic diagram of another embodiment of the amplifier in accordance with the present invention.

Another embodiment of an amplifier which can be used in accordance with the teachings of the present invention is shown in FIG. 7. In this embodiment, the clamping diodes are omitted, and transistors $Q_{1a}$ and $Q_{2a}$ are connected across the gate-source junctions of the FET's $Q_{11}$ and $Q_{12}$, respectively. The conductivity-type of each transistor, which is seen to be a bi-polar transistor, is opposite to the conductivity-type of the FET to which it is connected. The input voltage $V_i$ is applied to the base-emitter circuit of each bi-polar transistor. This is schematically represented by the separate sources e which are connected across the base-emitter circuit of the transistor $Q_{1a}$ and the base-emitter circuit of the transistor $Q_{2a}$, respectively. Hence, when one of the bi-polar transistors is driven into saturation by an input PWM signal, it is appreciated that its collector-emitter voltage, and thus the base-source voltage of its associated FET, is substantially zero. This serves to limit the forward-bias voltage which can be applied to each of the FET's. In addition, another voltage supply is connected across the collector electrodes of the bi-polar transistors $Q_{1a}$ and $Q_{2a}$ by the resistors $R_1$ and $R_2$, respectively, to thereby supply energizing voltages $+B_2$ and $-B_2$ to these resistors. Preferably, the resistors $R_1$ and $R_2$ are equal, and the magnitude of the energizing voltage $B_2$ is greater than the magnitude of the energizing voltage $B_1$. This also prevents the FET's $Q_{11}$ and $Q_{12}$ from receiving a large forward bias voltage. Thus, the clamping diodes, described hereinabove with respect to the embodiment shown in FIG. 4, are not necessary.

An example of the FET having triode-type dynamic characteristics which can be used in the amplifier shown in FIGS. 4 and 7 now will be described. Referring to FIG. 8, there is depicted a sectional view of one example of such an FET. The FET is a vertical junction structure formed of an intrinsic semiconductor region 11 having low impurity concentration and high resistance, a P-type semiconductor region 12 having an annular configuration and formed on the upper portion of the intrinsic region 11, and an N-type semiconductor region 13 having high impurity concentration formed over both the annular P-type region 12 and the intrinsic region 11, as shown. The P-type region 12 may be formed by conventional selective diffusion techniques and the N-type region 13 may be formed of conventional epitaxial techniques. Of course, other methods can be used to form these regions, as desired. Respective drain D, gate G and source S electrodes are provided at the lower surface of the intrinsic region 11, an exposed portion of the P-type annular region 12 and the upper surface of the N-type region 13, respectively.

The vertical junction FET depicted in FIG. 8 exhibits triode-type dynamic characteristics. A preferred embodiment of such an FET is depicted in FIG. 9 wherein like reference numerals identify corresponding elements. The FIG. 9 embodiment may be thought of as being formed by a combination of plural FET's of the type shown in FIG. 8 and closely resembles the aforedescribed FIG. 8 embodiment of the FET with the added modification that the P-type annular region 12 is formed with a mesh-type structure therewithin, as shown. Accordingly, the high impurity concentration N-type region 13 is seen to overly both the annular and mesh-shape P-type region 12 and the intrinsic region 11, the mesh-shape defining a boundary between the intrinsic region and the overlying high impurity concentration N-type region. Furthermore, an additional N-type semiconductor region 14 having high impurity concentration is formed on the lower surface of the intrinsic semiconductor region 11 and the drain electrode D is formed thereon. The additional N-type region serves to increase the breakdown voltage between the drain and source electrodes.

In the FET's shown in FIGS. 8 and 9, an increase in the magnitude of the gate voltage (here, of negative polarity as a reverse bias) causes depletion layers in the vicinity of the P-type gate region 12 to grow. These depletion layers are adjacent the annular structure of the P-type region as well as the mesh-type structure therewithin. The vertical channel is formed in the regions 11 and 13 between the depletion layer. In the illustrated example, since the channel is formed in the N-type region 13, the FET is designated as N-channel. Of course, if the region 13 is of P-type material (and the gate region 12 is of N-type material), the FET would be a P-channel device, such as the FET $Q_{11}$.

The equivalent internal resistance between the source and drain electrodes is a composite resistance comprised of the resistance between the source electrode and the channel within the FET, the resistance of the channel itself and the resistance between the channel and the drain electrode. In the prior art junction FET, the channel is a lateral channel having high resistance because of its narrow and long configuration. The source-to-channel resistance and the channel-to-drain resistance also are high. Consequently, the resistance of the prior art junction FET is very high. As a result of this high resistance, the prior art junction FET exhibits pentode-type dynamic characteristics and, as is apparent therefrom, the drain current becomes saturated as the drain voltage is increased.

In comparison to the aforedescribed prior art junction FET, the FET shown in FIGS. 8 and 9 is characterized by a relatively small separation between the source electrode S and the vertical channel and, additionally, the channel length itself is relatively small so that the ratio of channel width to length is larger than that of the prior art lateral channel FET. Consequently, the output resistance of the vertical junction FET depicted in FIGS. 8 and 9 is much smaller than the resistance of the prior art FET and is on the order of, for example, about 10 ohms. Accordingly, the drain current of the illustrated FET does not become saturated as the drain voltage increases. The voltage-current characteristics with respect to the drain electrode thus exhibit superior linearity over those of the prior art, thereby permitting effective use of the FET in an amplifier with high signal fidelity.

An illustration of the dynamic characteristics exhibited by the FET shown in FIGS. 8 and 9 is graphically represented in FIG. 10. This graphical representation depicts the relationship between the drain current $I_D$ and the drain voltage $V_D$. Each individual curve represents the current-voltage relationship for corresponding gate voltages $V_G$ wherein the gate voltage is the variable parameter. It is recognized that the characteristic curves shown in FIG. 10 are analogous to the curves which represent the dynamic characteristics of a conventionl triode. Therefore, because the FET's are of the type which exhibits triode-type dynamic characteristics, the output resistance is substantially constant and the FET is capable of producing a large output signal having little distortion.

Among the advantages attained by the use of the illustrated FET having triode-type dynamic characteristics is that the larger ratio of vertical channel width to channel length between the drain and source regions permits a higher drain current to flow. Another advantage is that a substantial portion of the characteristics curves depicting the relationship between drain current and voltage is linear so that odd harmonic distortion is reduced. Yet another advantage is the reduction in switching distortion which is attributed to the fact that the FET does not have the storage carriers which are included in bi-polar transistors. Still another advantage is the high input impedance of the FET. As a result of such input impedance, the load presented by an input source does not cause non-linear distortion. Yet a further advantage lies in the fact that, because of its low output resistance, the illustrated FET can readily drive a load which requires a relatively high damping factor. An additional advantage is that if the illustrated FET is used in the push-pull amplifier described in FIGS. 4 and 7, the complementary push-pull circuit, as shown, can be formed of simple circuit construction.

The conventional lateral junction FET cannot achieve the foregoing advantages, primarily because it exhibits pentode-type dynamic characteristics and thus has a very high output resistance, on the order, for example, of several megohms. Thus, with the conventional FET, as the drain voltage increases, the drain current is driven into saturation at a relatively low value of drain voltage. As is recognized, this phenomenon desirably is avoided by the present invention.

While the present invention has been particularly shown and described with reference to certain preferred embodiments, it will be readily apparent that various changes and modifications in form and details can be made by one of ordinary skill in the art without departing from the spirit and scope of the invention. Therefore, it is intended that the appended claims be interpreted as including such changes and modifications.

What is claimed is:

1. An amplifier comprising:
   first and second complementary field effect transistors connected to an output terminal in push-pull drain follower amplifying relation, with each of said field effect transistors exhibiting triode-type dynamic characteristics;
   voltage supply means coupled to said first and second field effect transistors for supplying energizing voltages thereacross;
   a load to be supplied with the signal amplified by said first and second field effect transistors;
   low-pass filter means for connecting said load to said output terminal;
   signal supply means for supplying a signal to be amplified to said first and second field effect transistors; and
   first and second voltage limiting means connected between the gate and source electrodes of said complementary field effect transistors, respectively, to limit the voltage between said electrodes and prevent said field effect transistors from being driven into their respective forward biased regions.

2. An amplifier in accordance with claim 1 wherein said first and second voltage limiting means each comprises a diode poled in the same direction as the gate-source junction of the field effect transistor to which it is connected.

3. An amplifier in accordance with claim 1 wherein said first and second voltage limiting means comprises means for normally supplying a reverse bias voltage to the gate electrodes of said field effect transistors; and first and second transistor means having output electrodes connected across the gate and source electrodes of said complementary field effect transistors, respectively, said first and second transistor means receiving said signal to be amplified.

4. An amplifier for pulse width modulated signals and the like, comprising:
   first and second complementary field effect transistors connected in push-pull relation and in drain-follower configuration, each of said field effect transistors exhibiting triode-type dynamic characteristics and being conductive for a drain signal current in the forward and reverse directions;
   first voltage supply means connected across the source electrodes of said complementary field effect transistors for supplying energizing voltages thereto;
   a load to be supplied with the signal amplified by said complementary field effect transistors;
   low-pass filter means for connecting said load to said complementary field effect transistors;
   first and second transistor means having their collector-emitter circuits connected across the gate and source electrodes of said first and second complementary field effect transistors, respectively;
   second voltage supply means connected across the collectors of said first and second transistor means by first and second resistance means, respectively, for supplying second energizing voltages thereto; and
   signal supply means connected to the bases of said first and second transistors for driving said first and second transistors in push-pull relation with an input signal to be amplified.

5. An amplifier in accordance with claim 4 wherein each of said first and second transistors is of a conductivity type opposite to that of the field effect transistor to which it is connected.

6. An amplifier in accordance with claim 4 wherein said low-pass filter means is a choke coil, said choke coil applying a reverse current to said complementary field effect transistors upon the occurrence of a pulse transition in said amplified signal.

7. An amplifier in accordance with claim 4 wherein said first and second resistance means are equal resistors.

8. An amplifier comprising:
a DC voltage source having first and second terminals;
first and second field effect transistors each having gate, source and drain electrodes;
circuit means connecting the source and drain electrodes of said first and second field effect transistors in push-pull drain follower amplifying relation between said first and second terminals of the DC voltage source;
an output terminal connected to said circuit means between said first and second field effect transistors;
signal supplying means for supplying a signal to be amplified to said gate electrodes of said first and second field effect transistors; and
output circuit means including inductance means and a load connected in series between said output terminal and a reference point so that the forward conductivity and thereverse conductivity of each of said first and second field effect transistors are substantially equal and substantially the same charging and discharging currents of said inductance means flow alternatively through said drain and source electrodes of each of said first and second field effect transistors when the respective transistor is in its conductive state.

9. An amplifier in accordance with claim 8 wherein said circuit means connects said source and drain electrodes of said first field effect transistor in a series circuit with said source and drain electrodes of said second field effect transistor between said first and second terminals of said DC voltage source.

10. An amplifier in accordance with claim 9 wherein said push-pull amplifying relation is a Class-D amplifier.

11. An amplifier in accordance with claim 8 wherein said signal supplying means comprises means for supplying a pulse-width modulated signal to the gate electrodes of said first and second field effect transistors.

12. An amplifier in accordance with claim 8 wherein said first and second field effect transistors are complementary field effect transistors.

13. An amplifier in accordance with claim 8 wherein said signal supplying means comprises voltage supply means for supplying further energizing voltages, and push-pull signal source means connected between the gate electrodes of said first and second field effect transistors and said voltage supply means to drive said field effect transistors in said push-pull relation.

* * * * *